(12) United States Patent
Ahmed et al.

(10) Patent No.: US 10,020,260 B1
(45) Date of Patent: Jul. 10, 2018

(54) CORROSION AND/OR ETCH PROTECTION LAYER FOR CONTACTS AND INTERCONNECT METALLIZATION INTEGRATION

(71) Applicant: GLOBALFOUNDRIES INC., Grand Cayman (KY)

(72) Inventors: Shafaat Ahmed, Ballston Lake, NY (US); Benjamin G. Moser, Malta, NY (US); Vimal Kumar Kamineni, Mechanicville, NY (US); Dinesh Koli, Clifton Park, NY (US); Vishal Chhabra, Clifton Park, NY (US)

(73) Assignee: GLOBALFOUNDRIES INC., Grand Cayman (KY)

(*) Notice: Subject to any disclaimer, the term of this patent is extended or adjusted under 35 U.S.C. 154(b) by 7 days.

(21) Appl. No.: 15/388,530

(22) Filed: Dec. 22, 2016

(51) Int. Cl.
| | |
|---|---|
| *H01L 23/48* | (2006.01) |
| *H01L 23/532* | (2006.01) |
| *H01L 23/528* | (2006.01) |
| *H01L 21/768* | (2006.01) |
| *H01L 21/265* | (2006.01) |
| *H01L 21/321* | (2006.01) |
| *H01L 21/3213* | (2006.01) |
| *H01L 23/522* | (2006.01) |

(52) U.S. Cl.
CPC ...... *H01L 23/53209* (2013.01); *H01L 21/265* (2013.01); *H01L 21/321* (2013.01); *H01L 21/32139* (2013.01); *H01L 21/7685* (2013.01); *H01L 21/76877* (2013.01); *H01L 23/528* (2013.01); *H01L 23/5226* (2013.01); *H01L 21/76807* (2013.01)

(58) Field of Classification Search
CPC ............... H01L 21/265; H01L 21/321; H01L 21/32139; H01L 21/768; H01L 21/76873; H01L 21/76877; H01L 21/76883; H01L 23/528; H01L 23/5226; H01L 23/53238; H01L 23/53233; H01L 23/53295; H01L 23/53209
USPC .................... 438/627–653; 257/751
See application file for complete search history.

(56) References Cited

U.S. PATENT DOCUMENTS

| | | | | |
|---|---|---|---|---|
| 8,440,564 B2 * | 5/2013 | Yu | ..................... | H01L 21/76849 257/E21.199 |
| 2006/0043589 A1 * | 3/2006 | Iwasaki | ............... | H01L 21/3105 257/751 |
| 2014/0264871 A1 * | 9/2014 | Lee | ................... | H01L 23/53238 257/751 |

* cited by examiner

*Primary Examiner* — Brook Kebede
(74) *Attorney, Agent, or Firm* — Francois Pagette; Andrew M. Calderon; Roberts Mlotkowski Safran Cole & Calderon, P.C.

(57) ABSTRACT

The present disclosure relates to semiconductor structures and, more particularly, to a corrosion and/or etch protection layer for contacts and interconnect metallization integration structures and methods of manufacture. The structure includes a metallization structure formed within a trench of a substrate and a layer of cobalt phosphorous (CoP) on the metallization structure. The CoP layer is structured to prevent metal migration from the metallization structure and corrosion of the metallization structure during etching processes.

18 Claims, 2 Drawing Sheets

CORROSION AND/OR ETCH PROTECTION LAYER FOR CONTACTS AND INTERCONNECT METALLIZATION INTEGRATION

FIELD OF THE INVENTION

The present disclosure relates to semiconductor structures and, more particularly, to a corrosion and/or etch protection layer for contacts and interconnect metallization integration structures and methods of manufacture.

BACKGROUND

Back end of the line (BEOL) and middle of the line (MOL) metallization is becoming more challenging in advanced technology nodes due to the critical dimension (CD) scaling and process capabilities. Also, improved wettability of Copper on Cobalt (Co) and lower resistance of Cobalt over a Ta liner and CuMn alloy seed layer has made Cobalt an excellent liner material for the replacement of Ta liners. For example, Cobalt is becoming a de facto liner and capping layer for BEOL dual damascene copper interconnect metallization processes.

For the MOL plugs (via) and local interconnect metallization, it has been observed that conformal chemical vapor deposition (CVD) tungsten processes provide seams/voids at the center of the features. These seams/voids cause higher contact/interconnect resistance and can become severe due to CD shrinkage in most advanced nodes, e.g., 7 nm technology. In addition, tungsten resistance cannot be reduced with post deposition annealing as it is a refractory metal and does not undergo grain growth or recrystallization at thermal budgets compatible with advanced semiconductor manufacturing. Moreover, the barrier and nucleation layers for tungsten based metallization do not scale to meet the resistance requirements. Therefore, effort has been made to replace the tungsten metallization with Cobalt due to Cobalt's unique void free fill capability which provides a lower resistance over the tungsten metallization.

The introduction of Cobalt for the CMOS local contacts and interconnect and its process integration also has immense challenges at current processing levels, a next level post final RIE wet etch process and/or hard mask removal processes. For example, it has been observed that Cobalt migrates on the surface of dielectric material which is a potential threat for short yield degradation as well as reliability issues (e.g., TDDB). For this reason, it is essential to anchor the Cobalt from migrating to the dielectric surface, which adds additional cost and processing time to the manufacturing process.

Also, in the case of Cobalt being used as a capping layer, it has been observed that Cobalt can easily diffuse to the dielectric capping layers. This diffusion can potentially cause TDDB failures. In the case of Cobalt being used as a liner or a capping layer for dual damascene copper metallization, the post reactive ion etch RIE) clean, e.g., wet cleans, can cause etching of the Cobalt from the liner and the capping layer. Moreover, in the case of complete Cobalt metallization (e.g., TiN/Co fill or TaN/Co fill or TiN or TaN/PVD/CVD Co seed/Co plating), the Cobalt trenches/ vias can be etched or corroded during a next level post final RIE wet clean and/or hard mask removal.

SUMMARY

In an aspect of the disclosure, a structure comprises: a metallization structure formed within a trench of a substrate; and a layer of cobalt phosphorous (CoP) on the metallization structure. The layer of CoP is structured to prevent metal migration from the metallization structure and corrosion of the metallization structure during etching processes.

In an aspect of the disclosure, a structure comprises: a Cobalt metallization layer formed within a trench of a dielectric material; a layer of cobalt phosphorous (CoP) on the Cobalt metallization layer, and a damascene structure formed directly on an exposed portion of the Cobalt material.

In an aspect of the disclosure, a method comprises: forming a Cobalt metallization structure within a trench of a substrate; and forming a layer of cobalt phosphorous (CoP) on the Cobalt metallization structure which is structured to prevent metal migration from the metallization structure and corrosion of the metallization structure during etching processes.

BRIEF DESCRIPTION OF THE DRAWINGS

The present disclosure is described in the detailed description which follows, in reference to the noted plurality of drawings by way of non-limiting examples of exemplary embodiments of the present disclosure.

DETAILED DESCRIPTION

The present disclosure relates to semiconductor structures and, more particularly, to a corrosion and/or etch protection layer for contacts and interconnect metallization integration structures and methods of manufacture. More specifically, the present disclosure provides an application of Cobalt Phosphorous (e.g., CoxPy; x=1, 2, . . . 5 and y=2) as a corrosion and/or etch protection layer for contacts and interconnect metallization integration.

Advantageously, by using the CoP it is now possible to protect the underlying Cobalt metallization structure (e.g., wiring structure) from being corroded during integration processes and more specifically during a post final RIE wet clean process. By using the CoP, it is also possible to anchor the underlying Cobalt metallization structure from being diffused to a dielectric material and NBLOCK layer, which will help obtain better reliability (e.g., both TDDB and electro-migration (EM)) of the device. The use of CoP will also enhance yields and can be easily integrated into process of record (POR) metallization processes.

In embodiments, a conformal CoP layer can be formed over the underlying Cobalt metallization structure to prevent Cobalt etch out and diffusion to the dielectric material and/or capping layers. The CoP layer can be formed by reacting the Cobalt surface with reactive Phosphorous, e.g., $PH_3$ plasma, as a source of P, or Trioctylphosphine (TOP)) treatment at the end of Cobalt metallization, before NBLOCK deposition. In embodiments, the CoP layer is corrosion resistant and works as a passivated surface blocking layer which prevents Cobalt diffusion (by anchoring the Cobalt). Also, as the CoP layer is corrosion resistant, it will not undergo a chemical attack by most chemistries used as a post final RIE wet clean. This will then protect the underlying Cobalt material during the etching processes. In further embodiments, at the end of post final RIE wet clean and prior to the metallization barrier and seed layer deposition process, hydrogen plasma treatment will help to minimize or reduce the CoP to the Cobalt surface.

The structures of the present disclosure can be manufactured in a number of ways using a number of different tools. In general, though, the methodologies and tools are used to form structures with dimensions in the micrometer and nanometer scale. The methodologies, i.e., technologies, employed to manufacture the structures of the present disclosure have been adopted from integrated circuit (IC) technology. For example, the structures are built on wafers and are realized in films of material patterned by photolithographic processes on the top of a wafer. In particular, the fabrication of the structures uses three basic building blocks: (i) deposition of thin films of material on a substrate, (ii) applying a patterned mask on top of the films by photolithographic imaging, and (iii) etching the films selectively to the mask.

Figure 1:
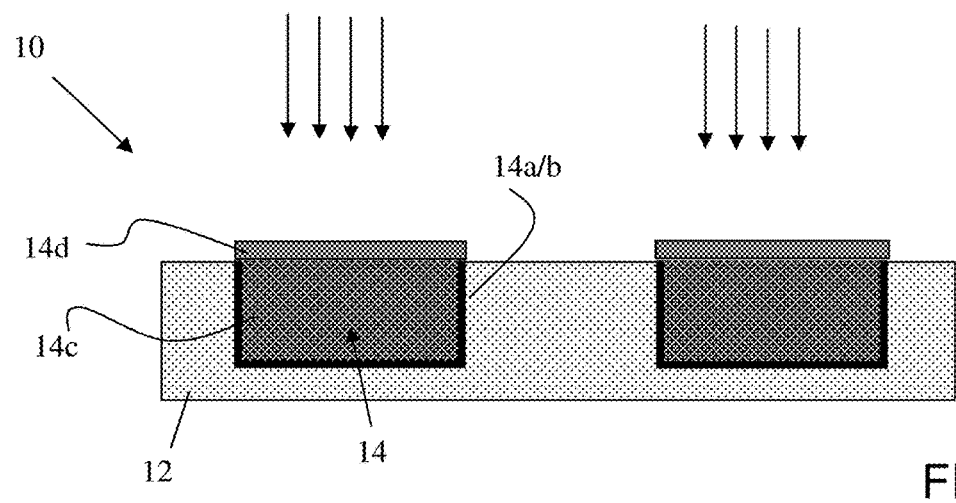
FIG. 1 shows a structure with a CoP layer and processing steps in accordance with an aspect of the present disclosure.

FIG. 1 shows a structure with a CoP layer and processing steps in accordance with an aspect of the present disclosure. More specifically, FIG. 1 shows a structure 10 comprising a first wiring layer 12. In embodiments, the first wiring layer 12 can comprise an interlevel dielectric material (e.g., oxide material) with one or more metallization structures 14. In embodiments, the metallization structures 14 can be Cobalt wiring structures.

In embodiments, the metal wiring structures 14 can be fabricated using conventional CMOS processes, e.g., photolithography and deposition processes. For example, a resist can be formed over the interlevel dielectric material 12 and exposed to energy (light) to form patterns. A reactive ion etching (RIE) process can be performed through the patterns to form trenches. The resist can be removed by conventional processes, e.g., oxygen ashing or other stripants. After trench formation and resist removal, the trench is filled with metal layers. For example, a TiN liner 14a can be deposited in the trench by conventional deposition processes, e.g., plasma enhanced vapor deposition (PEVPD), Atomic layer deposition (ALD) followed by a Cobalt seed layer or liner 14b deposited by a conventional deposition processes, e.g., chemical vapor deposition (CVD)/ALD process. A Cobalt material 14c then fills the remaining portion of the trench. In embodiments, the Cobalt material 14c can be deposited using a conventional deposition process, e.g., CVD/ALD. The structure 10 then undergoes a chemical mechanical planarization (CMP) process to remove the materials 14a-14c from a surface of the interlevel dielectric material 12.

Still referring to FIG. 1, the surface of the Cobalt material 14c can be dosed (e.g., low or medium or high or combination) with Phosphorus to form a Cobalt Phosphorus (CoP) layer 14d directly on the surface of the Cobalt material 14c. In embodiments, the dosing can be a reactive Phosphorous, e.g., $PH_3$ plasma, which can be controlled to achieve the require thickness (e.g., few monolayer to nm range) of the CoP layer 14d. In more specific embodiments, the thickness of the CoP layer 14d can be about 3 Å to 30 Å and more preferably about 20 Å to 30 Å, and the dosing can be by ion implantation process of Phosphorus at, for example, implanting Phosphorus around 0.5 to 2 keV energy range and 0.5 to 2e15 dose range into cobalt as in a single case of Phosphorus at 1 keV 2E15 dose into cobalt. Simulations show peak Phosphorus concentration is approximately 15 Å deep with approximately 9 Å straggle with peak Phosphorus concentration of about 8E+21 (#/$cm^3$). Further, simulation show Phosphorus at 1 keV 2E15 dose will have a surface Phosphorus concentration of about ½ of peak concentration at about 4E+21 (#/$cm^3$). In alternative embodiments, the surface of the Cobalt material 14c can be treated using Trioctylphosphine (TOP) using a range of temperature from about 100° C. to about 400° C. In this process, the CoP layer 14d can be formed through the reaction of Cobalt with the TOP.

Based on dose, reaction and energy of the ion implantation process or the time, temperature and concentration of the TOP process, a range of CoP compounds can be achieved. For example, the following CoP compounds can be formed by the processes described herein: $CoP_2$, CoP, $Co_3P_2$, $Co_2P$, $Co_5P_2$ CoOP, $CoOP_2$ or cobalt oxide phosphide As noted above, the CoP layer 14d (and its compounds) is corrosion resistant and has a higher etch resistant budget against the reactive RIE species. Hence, the CoP layer 14d prevents the etch out of the underlying Cobalt material 14c during post RIE final clean, as the CoP layer 14d will act as a barrier layer. The passivated CoP layer 14d also protects the progressive oxidation of Co during air exposure and aging.

Figure 2:
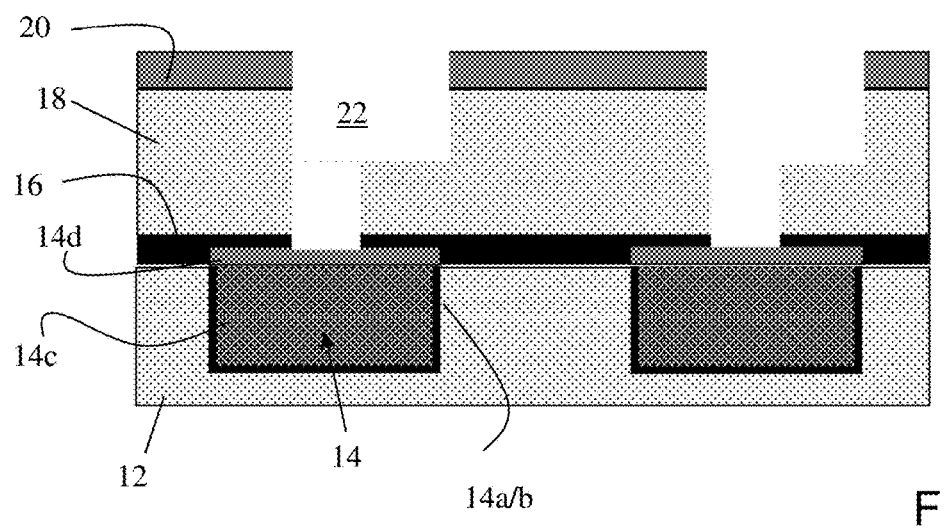
FIG. 2 shows a via and trench structures exposing a surface of the CoP layer, amongst other features, and processing steps in accordance with an aspect of the present disclosure.

FIG. 2 shows a structure with a via and trench structure exposing a surface of the CoP layer and processing steps in accordance with an aspect of the present disclosure. More specifically, in FIG. 2, an NBLOCK (nitride material) 16 is formed over the CoP layer 14d and any exposed surfaces of the interlevel dielectric material 12. The NBLOCK 16 can be formed by any conventional deposition process, e.g., CVD. An interlevel dielectric material 18 is formed on the NBLOCK 16. In embodiments, the interlevel dielectric material 18 can be formed by a conventional CVD process. In embodiments, the CoP layer 14d will prevent the migration of the Cobalt layer 14c into the interlevel dielectric material 18 or NBLOCK 16, thus preventing possible failures, etc. A metal layer 20 can be formed on the surface of the interlevel dielectric material 18. In embodiments, the metal layer 20 can be TiN, formed using conventional CVD processes.

Still referring to FIG. 2, dual damascene structures (via and trench structures) 22 are formed through the metal layer 20, interlevel dielectric material 18 and NBLOCK 16, stopping on the CoP layer 14d. In embodiments, the dual damascene structures 22 can be formed by a conventional dual damascene process (RIE); although several single damascene processes are also contemplated herein. As should now be understood by those of skill in the art, the CoP layer 14d will act as an etch stop layer, preventing the etching process from attacking the underlying Cobalt layer 14c. Also, a final RIE and clean (e.g., wet clean) process can be performed on the exposed surfaces of the via and trench structures 22. Again, as should now be understood by those of skill in the art, the final RIE and clean processes will not attack or etch out the underlying Cobalt layer 14c, as it remains protected by the CoP layer 14d. That is, the CoP layer 14d is corrosion resistance to the etch chemistries and thus has a higher budget against the reactive RIE species than the underlying Cobalt layer 14c.

Figure 3:
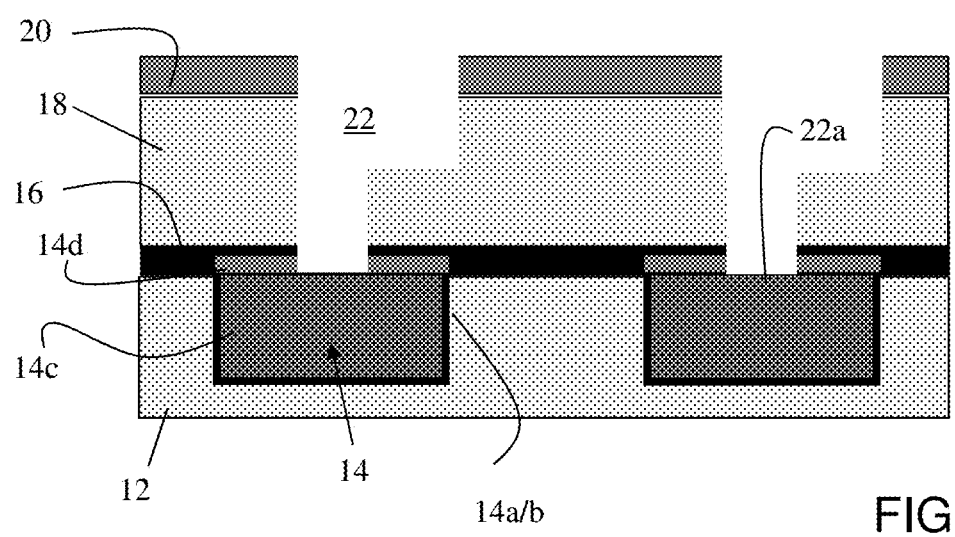
FIG. 3 shows a structure with an exposed surface of a metallization structure (Cobalt) and processing steps in accordance with an aspect of the present disclosure.

FIG. 3 shows a structure with an exposed surface of the Cobalt layer 14c and processing steps in accordance with an aspect of the present disclosure. In particular, FIG. 3 shows the structure undergoing an additional etching process to expose the Cobalt layer 14c as represented at reference numeral 22a.

More specifically, in FIG. 3, at the end of post final RIE wet clean process, a hydrogen plasma treatment can be performed to remove portions of the CoP layer 14d, exposing the Cobalt layer 14c. In embodiments, the hydrogen plasma treatment can be, for example, a short time bias $N_2+H_2$ RIE or an $H_2$ plasma to ash process to remove or reduce the CoP layer 14d. The hydrogen plasma treatment can be provided prior to the metallization barrier and via interconnect or other wiring structures formed in the dual damascene structures. (The metallization barrier and via interconnect or other wiring structures are also represented by reference numeral 22.) Also, a seed layer will help to minimize or reduce CoP layer 14d to the Cobalt surface 22a. In embodiments, the dual damascene structures 22 can be filled with metal or metal alloy to form upper metallization layers during back end of the line (BEOL) processes.

The method(s) as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed:

1. A structure comprising:
   a wiring structure composed of Cobalt material formed within a trench of a substrate; and
   a layer of cobalt phosphorous (CoP) on the wiring structure which is structured to prevent metal migration from the wiring structure and corrosion of the wiring structure during etching processes.

2. The structure of claim 1, wherein the wiring structure is lined with TiN, under the Cobalt material.

3. The structure of claim 1, wherein the layer of CoP is about 3 Å to 30 Å in thickness.

4. The structure of claim 3, wherein the layer of CoP is a compound of one of $CoP_2$, CoP, $Co_3P_2$, $Co_2P$, $Co_5P_2$, CoOP, $CoOP_2$ or cobalt oxide phosphide.

5. The structure of claim 1, wherein the layer of CoP has an opening to expose the Cobalt material.

6. The structure of claim 5, further comprising a blocking material and a dielectric material formed over the layer of CoP.

7. The structure of claim 6, wherein a dual damascene structure is formed in the dielectric material, blocking material and the layer of CoP to expose a portion of the Cobalt material.

8. A structure comprising:
   a Cobalt metallization layer formed within a trench of a dielectric material;
   a layer of cobalt phosphorous (CoP) on the Cobalt metallization layer; and
   a damascene structure formed directly on an exposed portion of the Cobalt material.

9. The structure of claim 8, wherein the layer of CoP is structured to prevent metal migration from the metallization structure and corrosion of the metallization structure during etching processes.

10. The structure of claim 8, wherein the layer of CoP is directly on the Cobalt metallization layer.

11. The structure of claim 8, wherein the layer of CoP is a compound of one of $CoP_2$, CoP, $Co_3P_2$, $Co_2P$ or $Co_5P_2$.

12. The structure of claim 11, wherein the layer of CoP is about 20 Å to 30 Å in thickness.

13. The structure of claim 12, further comprising a blocking material and a dielectric material formed over the layer of CoP.

14. The structure of claim 13, wherein the damascene structure is a dual damascene structure formed in the dielectric material and blocking material above the layer of CoP.

15. A method, comprising:
    forming a Cobalt metallization structure within a trench of a substrate; and
    forming a layer of cobalt phosphorous (CoP) on the Cobalt metallization structure which is structured to prevent metal migration from the metallization structure and corrosion of the metallization structure during etching processes.

16. The method of claim 15, wherein the forming of the layer of CoP comprises ion implantation of the Cobalt metallization structure with a reactive Phosphorus.

17. The method of claim 15, wherein the forming of the layer of CoP comprises treating a surface of the Cobalt metallization structure with Trioctylphosphine (TOP).

18. The method of claim 17, wherein the forming of the layer of CoP comprises treating a surface of the Cobalt material with Trioctylphosphine (TOP) using a range of temperatures from about 100° C. to about 400° C.

* * * * *